United States Patent
Mustafa et al.

(10) Patent No.: US 11,976,363 B2
(45) Date of Patent: May 7, 2024

(54) PURGE RING FOR PEDESTAL ASSEMBLY

(71) Applicant: Applied Materials, Inc., Santa Clara, CA (US)

(72) Inventors: Muhannad Mustafa, Milpitas, CA (US); Mario D. Silvetti, Fountain Hills, AZ (US); Kevin Griffin, Livermore, CA (US)

(73) Assignee: Applied Materials, Inc., Santa Clara, CA (US)

( * ) Notice: Subject to any disclaimer, the term of this patent is extended or adjusted under 35 U.S.C. 154(b) by 204 days.

(21) Appl. No.: 17/407,086

(22) Filed: Aug. 19, 2021

(65) Prior Publication Data

US 2023/0059232 A1    Feb. 23, 2023

(51) Int. Cl.
C23C 16/458     (2006.01)
H01L 21/687     (2006.01)
H01L 21/02      (2006.01)

(52) U.S. Cl.
CPC .... *C23C 16/4585* (2013.01); *H01L 21/68735* (2013.01); *H01L 21/02337* (2013.01); *H01L 21/02656* (2013.01)

(58) Field of Classification Search
None
See application file for complete search history.

(56) References Cited

U.S. PATENT DOCUMENTS

| | | | |
|---|---|---|---|
| 5,766,365 A * | 6/1998 | Umotoy | H01L 21/68735 118/500 |
| 6,179,924 B1 * | 1/2001 | Zhao | C23C 16/52 118/728 |
| 6,263,829 B1 * | 7/2001 | Schneider | C23C 16/45521 118/723 MP |
| 6,306,244 B1 * | 10/2001 | Kennedy | H01J 37/321 118/728 |
| 6,364,957 B1 * | 4/2002 | Schneider | C23C 16/4585 118/500 |
| 10,062,587 B2 | 8/2018 | Chen et al. | |
| 10,519,546 B2 | 12/2019 | Jallepally et al. | |
| 10,704,147 B2 | 7/2020 | Rasheed et al. | |
| 2002/0001928 A1 | 1/2002 | Wang et al. | |
| 2004/0003780 A1 | 1/2004 | Yudovsky et al. | |

(Continued)

FOREIGN PATENT DOCUMENTS

| | | |
|---|---|---|
| CN | 104711542 A | 6/2015 |
| WO | 2020263939 A1 | 12/2020 |

OTHER PUBLICATIONS

PCT International Search Report and Written Opinion in PCT/US2022/040417 dated Dec. 8, 2022, 10 pages.

*Primary Examiner* — Jeffrie R Lund
*Assistant Examiner* — Tiffany Z Nuckols
(74) *Attorney, Agent, or Firm* — Servilla Whitney LLC

(57) ABSTRACT

Pedestal assemblies, purge rings for pedestal assemblies, and processing methods for increasing residence time of an edge purge gas in heated pedestal assemblies are described. Purge rings have an inner diameter face and an outer diameter face defining a thickness of the purge ring, a top surface and a bottom surface defining a height of the purge ring, and a thermal expansion feature. Purge rings comprise a plurality of apertures extending through the thickness and aligned circumferentially with a plurality of circumferentially spaced purge outlets in a substrate support.

15 Claims, 4 Drawing Sheets

(56) References Cited

U.S. PATENT DOCUMENTS

| | | | |
|---|---|---|---|
| 2006/0207509 A1* | 9/2006 | Tomita | H01L 21/67017 |
| | | | 118/728 |
| 2007/0033824 A1* | 2/2007 | Okajima | H01L 21/67103 |
| | | | 34/239 |
| 2015/0047564 A1* | 2/2015 | Kim | C23C 16/45521 |
| | | | 118/721 |
| 2016/0002778 A1 | 1/2016 | Ravi et al. | |
| 2016/0181142 A1* | 6/2016 | Raj | H01L 21/67098 |
| | | | 264/129 |
| 2018/0358768 A1 | 12/2018 | Mustafa et al. | |
| 2019/0390337 A1 | 12/2019 | Mustafa et al. | |

* cited by examiner

PURGE RING FOR PEDESTAL ASSEMBLY

TECHNICAL FIELD

Embodiments described herein generally relate to apparatuses for pedestal assemblies. In particular, embodiments of the disclosure are directed to purge rings for heated pedestal assemblies.

BACKGROUND

In a semiconductor wafer processing chamber, such as an atomic layer deposition (ALD) chamber or a chemical vapor deposition (CVD) chamber, wafer backside pressure control and edge purge provide advantages for wafer processing. Wafer backside pressure control can provide improved temperature uniformity of the wafer. Edge purging can prevent deposition on the backside and curved edge of the wafer.

Conventional backside pressure control is accomplished with a seal band on the pedestal surface near the wafer edge. The gas flow path goes through the pedestal to a pocket behind the wafer and into the seal band. Pressure control is done with a component that controls flow rate, measures pressure, and has a flow path to a pump that bypasses the chamber.

Conventional edge purge can be accomplished by a couple different techniques. Gas can be delivered through a line in the pedestal and distributed to the edges underside of the wafer edge through either a recursive channel, a plenum near the circumference of the pedestal, or a combination of both. This technique requires an edge ring design that goes around the wafer to direct the flow of gas. The edge ring can be integrated into the pedestal or a separate component. The edge purge techniques are limited in effectiveness based on how well the flow can be distributed around the edge of the wafer.

Argon (Ar) is a commonly used gas for edge purging. Though argon (Ar) flows through the heater during edge purging, the pedestal assembly setpoint temperature is often lower than the wafer temperature. Consequentially, commonly used apparatuses and methods of edge purging experience a cooling effect at the wafer edge which may lead to a reduction in film thickness. It has been discovered that increasing residence time of argon (Ar) increases argon (Ar) flow temperature. Therefore, there is a need in the art for improved apparatuses and methods of edge purging to reduce the cooling effect at the wafer edge.

Accordingly, there is a need for purge rings that reduce the cooling effect at the wafer edge by increasing the residence time of argon (Ar).

SUMMARY

One or more embodiments of the disclosure are directed to a pedestal assembly comprising a substrate support having a support surface with a support surface outer edge and an outer peripheral ledge with a ledge top surface and a ledge outer peripheral face. The outer peripheral ledge includes a plurality of circumferentially spaced purge outlets extending radially inward from the ledge outer peripheral face into the substrate support, the ledge top surface below the support surface. The pedestal assembly comprises a purge ring having an inner diameter face and an outer diameter face defining a thickness of the purge ring, and a top surface and a bottom surface defining a height of the purge ring. The purge ring comprising a plurality of apertures extending through the thickness and aligned circumferentially with the plurality of circumferentially spaced purge outlets.

Additional embodiments of the disclosure are directed to processing methods comprising increasing a residence time of an edge purge gas in a heated pedestal assembly by incorporating a purge ring around a ledge outer peripheral face of a substrate support. The purge ring has an inner diameter face and an outer diameter face defining a thickness of the purge ring, and a top surface and a bottom surface defining a height of the purge ring. The purge ring comprises a plurality of apertures extending through the thickness and aligned circumferentially with a plurality of circumferentially spaced purge outlets in the substrate support.

Further embodiments of the disclosure are directed a purge ring for a substrate support pedestal. The purge ring comprises an inner diameter face and an outer diameter face defining a thickness of the purge ring in a range of 1 mm to 5 mm, a top surface and a bottom surface defining a height of the purge ring, a thermal expansion feature, and a plurality of apertures in a range of 6 to 36 apertures. Each of the plurality of apertures have a round shape with a diameter in a range of 20 mil to 50 mil and extend through the thickness of the purge ring and aligned circumferentially with a plurality of circumferentially spaced purge outlets in the substrate support pedestal. The substrate support pedestal and purge ring comprise complementary alignment features configured to cooperatively interact to align the plurality of apertures with the plurality of circumferentially spaced purge outlets. The purge ring has an inner diameter in a range of 0.5 mil to 5 mil greater than an outer diameter of a ledge outer peripheral face of the substrate support pedestal when the substrate support pedestal and the purge ring are at a temperature of 375° C.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Figure 1:
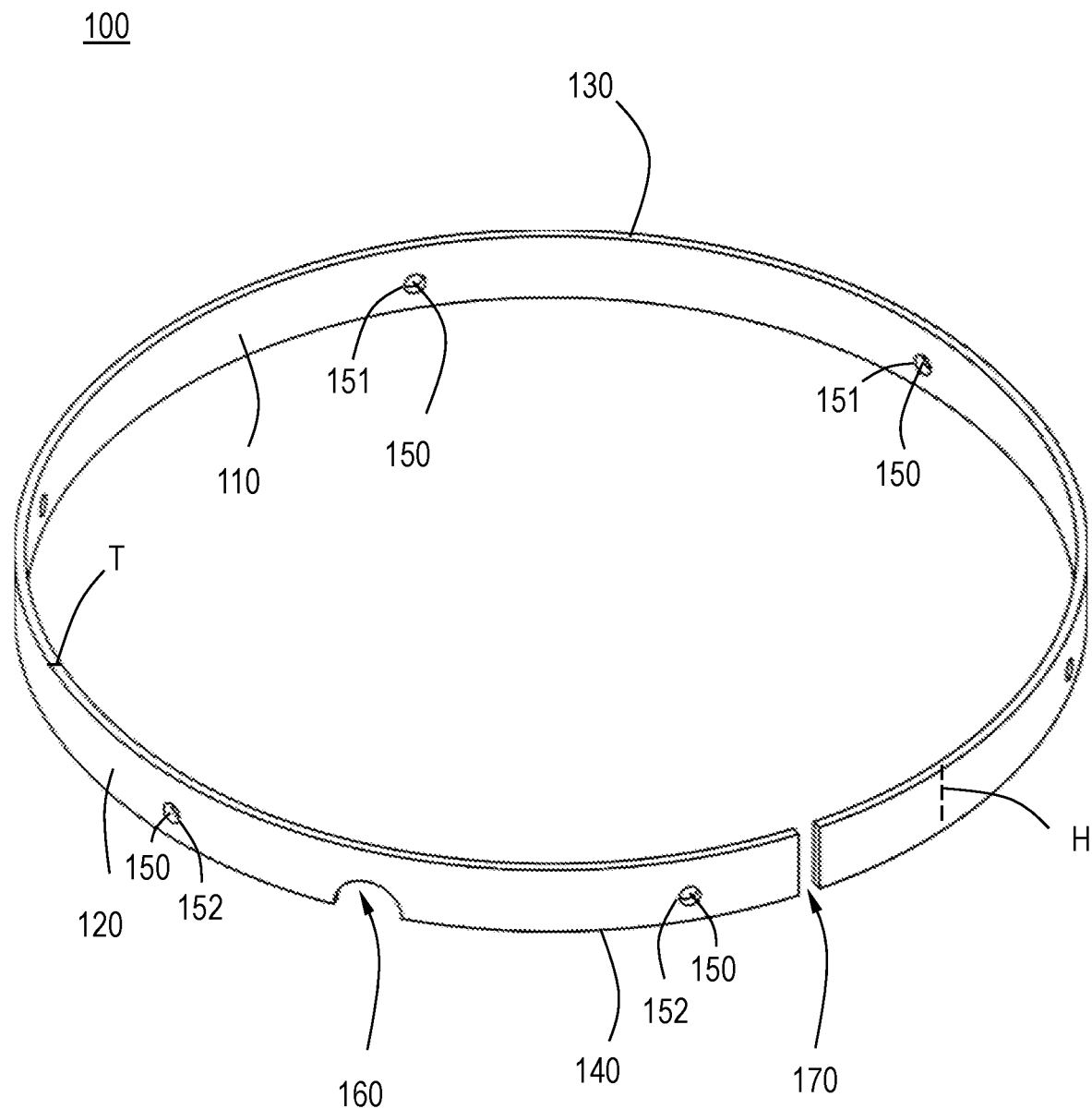
FIG. 1 illustrates a cross-sectional view of a purge ring according to one or more embodiments of the disclosure.

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus, for example, where a film/layer or partial film/layer has been deposited onto a substrate surface, the exposed surface of the newly deposited film/layer becomes the substrate surface.

As used in this specification and appended claims, "substrate support" and "substrate support pedestal" may be used interchangeably.

As used in this specification and appended claims, use of relative terms like "above" and "below" should not be taken as limiting the scope of the disclosure to a physical orientation in space. Accordingly, use of relative terms should not be limited to the direction specified by gravity.

Embodiments of the disclosure relate to pedestal heater designs to provide uniform temperature distributions on the wafer at multiple operating temperatures (e.g., 150° C.-550° C.). Some embodiments provide a pedestal heater with multiple heating zones (e.g., three zones). In some embodiments, the multi-zone heater allows for local profile tuning on the heater center and/or edge. Some embodiments provide a purge ring with increased thermal uniformity and/or increased purge efficiency.

Referring to FIG. 1, one or more embodiments of the disclosure are directed to a purge ring 100. The purge ring 100 has an inner diameter face 110 and an outer diameter face 120 defining a thickness T of the purge ring. The inner diameter face 110 and the outer diameter face 120 define a thickness T of the purge ring 100. In some embodiments, the thickness T of the purge ring 100 is in the range of 1 mm to 5 mm.

In one or more embodiments, the purge ring 100 comprises a plurality of apertures 150 extending through the thickness T. In one or more embodiments, the plurality of apertures 150 is in a range of 6 to 36 apertures. While the apertures 150 illustrated in the Figures are generally round, the skilled artisan will recognize that the shape of the apertures 150 are not limited to round openings. In one or more embodiments, the plurality of apertures 150 can be any suitable shape such as round, square, rectangular or any other polygonal shape.

The size of the apertures 150 openings in the inner and outer faces of the purge ring 100 can be uniform or varied both inter-opening and intra-opening. For example, the inner opening 151 of the apertures 150 on the inner diameter face 110 of the purge ring 100 may have a different size that the outer opening 152 on the outer diameter face 120 of the purge ring 100. In one or more embodiments, each of the plurality of apertures 150 have a larger outer opening 152 in the outer diameter face 120 than the inner opening 151 in the inner diameter face 110. The diameter of each of the apertures 150 is measured at the relevant face of the ring unless otherwise specified.

In one or more embodiments, each of the plurality of apertures 150 has a round shape with a diameter in a range of 10 mil to 80 mil, or in the range of 20 mil to 50 mil. Smaller diameter apertures 150 increases the backpressure and decreases the flow rate, increasing the residence time of the gas. In some embodiments, each of the plurality of apertures 150 has a hydraulic diameter in the range of 10 mil to 80 mil, or in the range of 20 mil to 50 mil.

The purge ring 100 has a top surface 130 and a bottom surface 140 defining a height H of the purge ring 100. The purge ring 100 has a height H greater than the diameter of the apertures.

The purge ring 100 of some embodiments incorporates an alignment feature 160. The alignment feature 160 is configured to cooperatively interact with an alignment feature on a separate component to aid in positioning of the purge ring 100 relative to the separate component to allow the apertures 150 to be aligned with a portion of the separate component, as discussed further below. The alignment feature 160 can be any suitable shape or size to permit cooperative interaction. In the illustrated embodiment, the alignment feature 160 is a arc-shaped cutout formed in the bottom surface 140 of the purge ring 100. The skilled artisan will recognize that the alignment feature 160 is not limited to the illustrated arc-shaped cutout and that other features are within the scope of the disclosure. For example, the alignment feature 160 illustrated in FIG. 2B is a recess formed in the inner diameter face 110 of the purge ring 100.

In one or more embodiments, the purge ring 100 comprises a thermal expansion feature 170. In one or more embodiments, the thermal expansion feature may be a groove or break positioned in a predetermined position in the purge ring 100. In the embodiment illustrated in FIG. 1, the thermal expansion feature 170 is a break in the continuity of the purge ring 100. In some embodiments, the thermal expansion feature 170 does not break the continuity of the purge ring 100. For example, the thermal expansion feature 170 of some embodiments comprises a region with decreased thickness T. In some embodiments, the thermal expansion feature 170 has a width in the range of 0.5 mm to 2 mm.

Figure 2A:
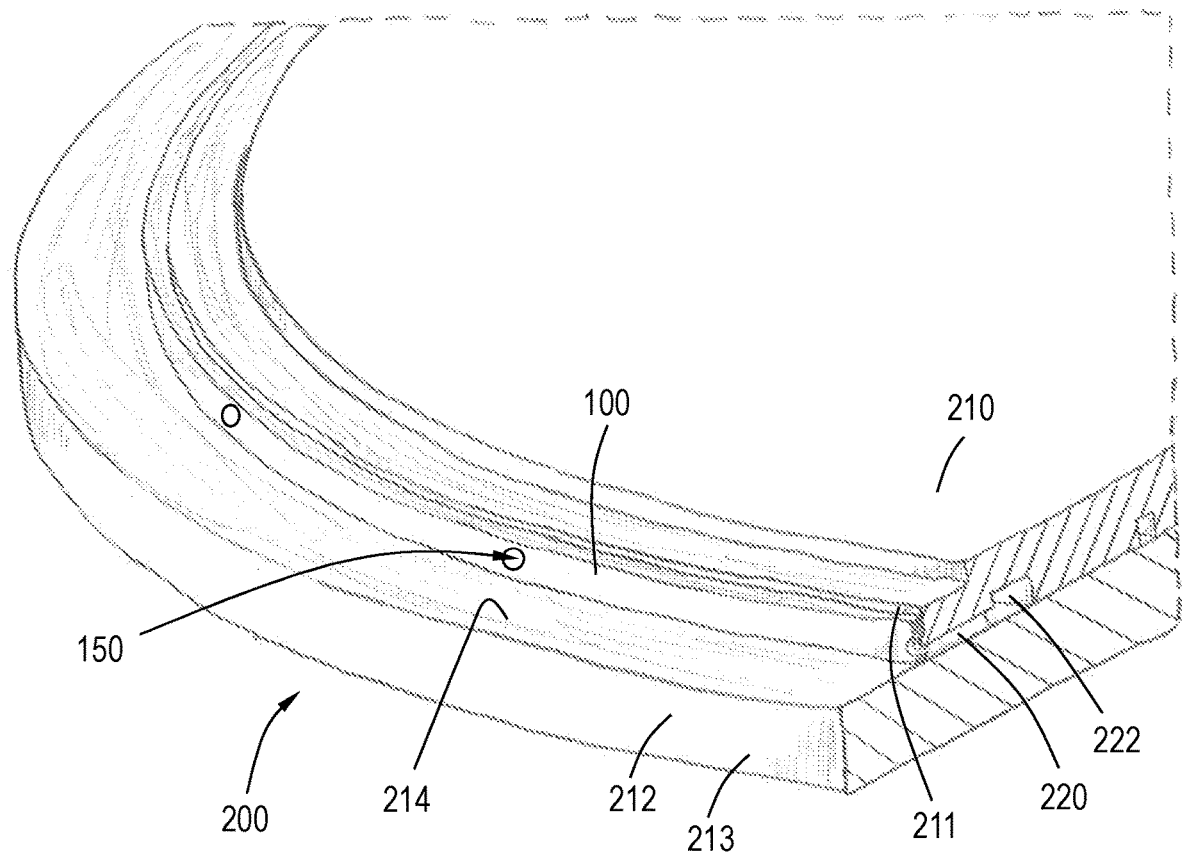
FIG. 2A illustrates a partial cross-sectional view of the purge ring on a substrate support according to one or more embodiments of the disclosure.
Figure 2B:
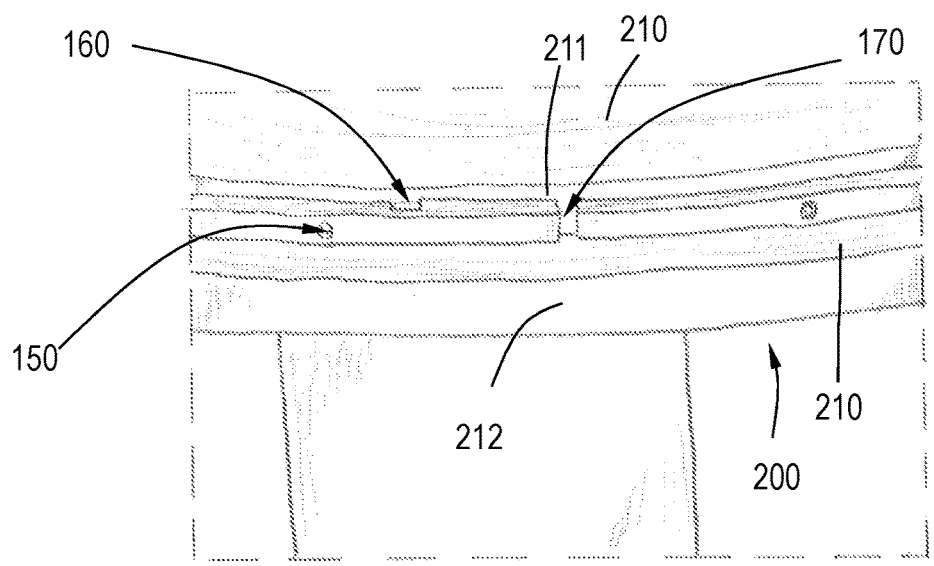
FIG. 2B illustrates an exploded view of the purge ring of FIG. 2A.

Referring to FIG. 2A, a partial view of the purge ring 100 on a substrate support 200 is shown, with cross-section illustrated. FIG. 2B shows an expanded view of a purge ring 100 on a substrate support 200. In one or more embodiments, the purge ring 100 is removable from the substrate support 200. In some embodiments, the purge ring 100 is affixed to the substrate support 200 in a manner sufficient to limit removal.

In one or more embodiments, the substrate support 200 has a substrate support surface 210 upon which a wafer can be supported during processing. The illustrated substrate support 200 includes an outer peripheral ledge 212 with a ledge outer peripheral face 211 and ledge top surface 214 and defining an outer diameter face 213 of the substrate support surface 210. The ledge top surface 214 is below the support surface 210.

The ledge outer peripheral face 211 of the substrate support surface 210 has an outer diameter in the range of 290 mm to 310 mm. In one or more embodiments, the purge ring 100 has an inner diameter in a range of 0.5 mil to 5 mil greater than an outer diameter of the ledge outer peripheral face 211 of the substrate support surface 210 when the substrate support pedestal 200 and the purge ring 100 are at a temperature of 300° C. to 500° C. In one or more embodiments, increasing the temperature of the substrate support pedestal 200 and the purge ring 100 decreases the difference between the inner diameter of the purge ring 100 and the ledge outer peripheral face 211.

The outer peripheral face 211 has a plurality of circumferentially spaced purge outlets 220 extending radially inward from the ledge outer peripheral face 211 into the substrate support 200. In the illustrated embodiment, the circumferentially spaced purge outlets 220 extend from the ledge outer peripheral face 211 to a purge channel 222 within the substrate support 200. The purge channel 222 of some embodiments comprises one or more channels formed in a bottom of the upper portion of the substrate support that forms an enclosed spaced when the upper portion is joined with the lower portion of the substrate support. The skilled artisan will recognize how the substrate support can be formed by joining the upper portion and lower portion.

In one or more embodiments, each of the plurality of apertures 150 of the purge ring 100 are aligned with one of the circumferentially spaced purge outlets 220 in the substrate support 200. In one or more embodiments, the substrate support 200 and the purge ring 100 further comprise complementary alignment features 160 configured to cooperatively interact to align the plurality of apertures 150 with the plurality of circumferentially spaced purge outlets 220. For example, in the embodiment illustrated in FIG. 2B, the alignment features 160 comprise a recess formed in the inner diameter face of the purge ring and a complementary protrusion formed in the ledge outer peripheral face 211 of the substrate support 200.

Figure 3:
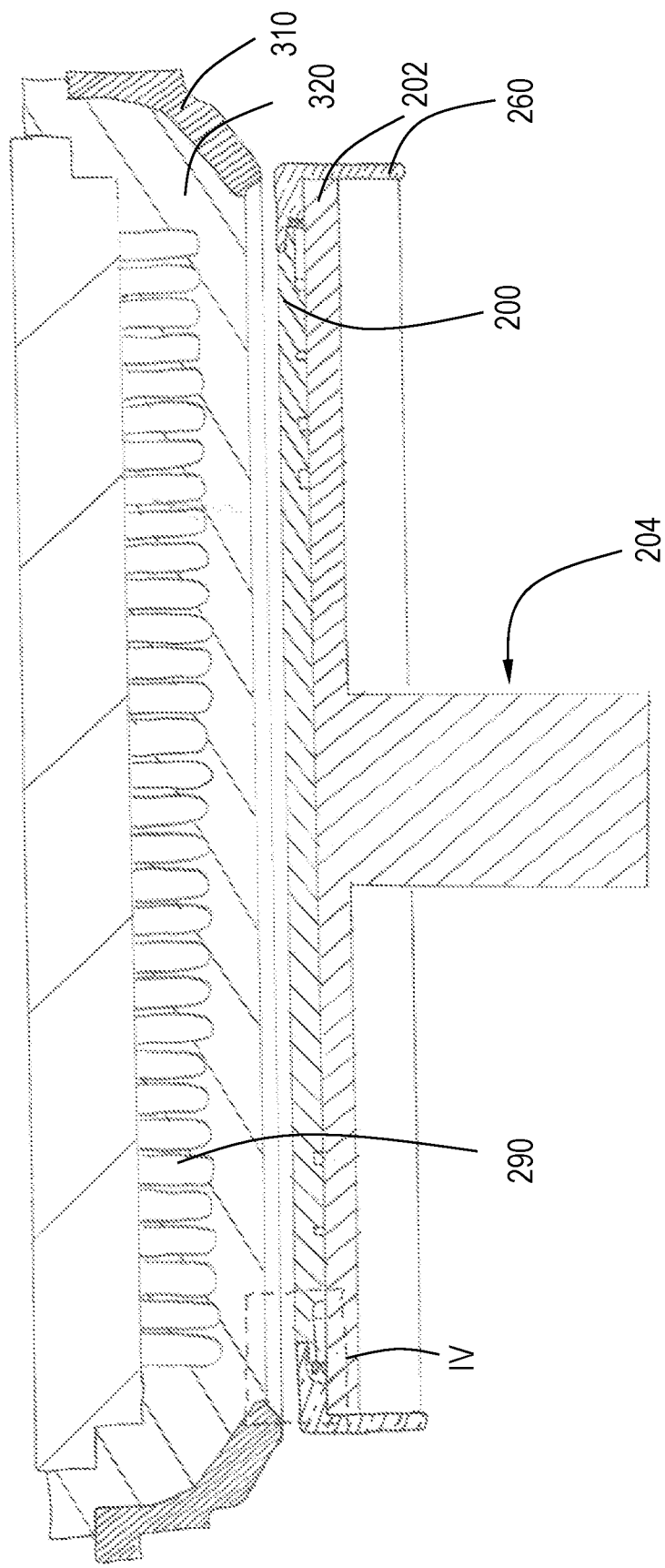
FIG. 3 illustrates a cross-sectional view of a pedestal assembly according to one or more embodiment of the disclosure.

FIG. 3 illustrates a cross-sectional view of a portion of a processing chamber including a substrate support 200, a showerhead 320 and spacer ring 310. In the illustrated embodiment, the substrate support 200 includes a purge ring 100 and edge ring 260, as illustrated in expanded view of region IV shown in FIG. 4. In some embodiments, the substrate support 200 is configured as an electrostatic chuck. In some embodiments, one or more electrodes are within the support base 204 thickness and are configured to form an electrostatic chuck. In some embodiments, the one or more electrodes are located at an electrode depth (not shown) from the bottom surface of the substrate support 200. In some embodiments, the one or more electrodes are configured as a monopolar electrostatic chuck. In some embodiments, the one or more electrodes are configured as a bipolar electrostatic chuck. The one or more electrodes can be connected to one or more power supplies (not shown) to polarize the electrodes to act as an electrostatic chuck.

In one or more embodiments, the pedestal assembly 300 comprises a support base 204 having a top surface. In one or more embodiments, the substrate support 200 comprises a heater 202 on the top surface of the support base 204.

Figure 4:
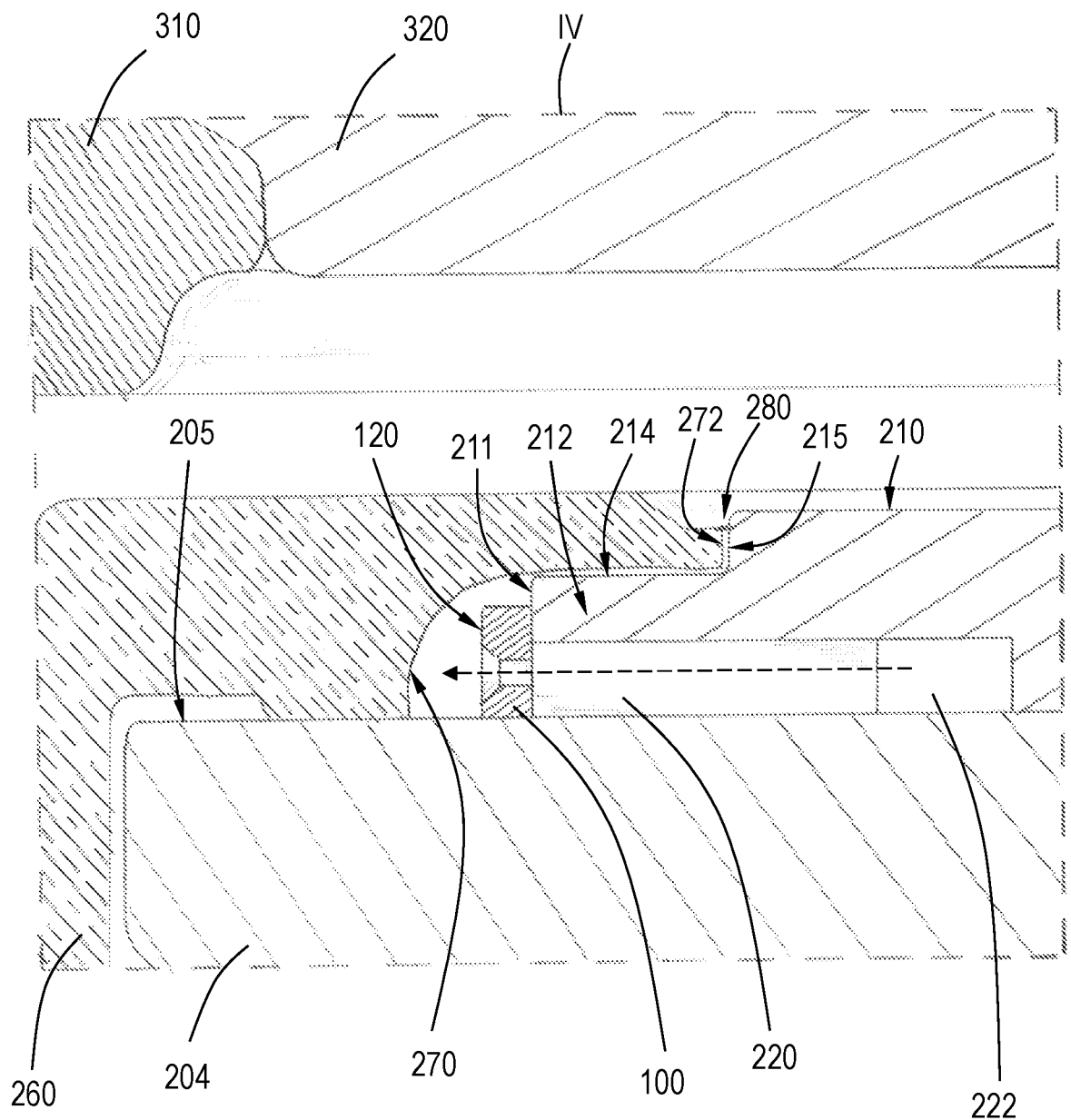
FIG. 4 illustrates an exploded partial cross-sectional view of the pedestal assembly of FIG. 3.

FIG. 4 illustrates an expanded view of region IV of FIG. 3. In one or more embodiments, the substrate support 200 has an outer peripheral ledge 212 with a ledge top surface 214 and a ledge outer peripheral face 211. The outer peripheral ledge 212 has a plurality of circumferentially spaced purge outlets 220 extending radially inward from the ledge outer peripheral face 211 into the substrate support 200. In one or more embodiments, the ledge top surface 214 is below the substrate support surface 210.

In the embodiment shown in FIGS. 3 and 4, an edge ring 260 is positioned on an outer peripheral portion of the top surface 205 of the support base 204. In one or more embodiments, the edge ring 260 has a purge face 270 extending inwardly over the ledge top surface 214 to a purge inner face 272 spaced a distance from the support surface outer edge 215 to form an edge purge flow path 280 between the ledge outer peripheral face 211, through the purge ring 100 and between the ledge top surface 214 and the purge face 270 and between the support surface outer edge 215 and purge inner face 272. In one or more embodiments, the purge inner face 272 abuts the support surface outer edge 215.

Some embodiments provide a processing method comprising increasing a residence time of an edge purge gas in a heated pedestal assembly 300. In one or more embodiments, the processing method comprises incorporating the purge ring 100 around a ledge outer peripheral face 211 of a substrate support 200. In one or more embodiments, the edge purge gas comprises argon (Ar).

In one or more embodiments, the edge purge gas comprising argon (Ar) has a specific heat of 312° C. In one or more embodiments, the specific heat is an amount heat required to increase a temperature of a unit of mass by 1° C. In one or more embodiments, the heated pedestal assembly 300 having the purge ring 100 can increase the specific heat of argon (Ar) at a faster rate than a heated pedestal assembly without a purge ring.

In one or more embodiments, incorporating the purge ring 100 in the heated pedestal assembly 300 comprises aligning an alignment feature on the purge ring 100 with a complementary alignment feature on the substrate support 200. In one or more embodiments, the purge ring 100 increases a residence time of argon (Ar). In one or more embodiments, when a purge ring is not present, the residence time of argon (Ar) is in a range of 0.4 to 0.55 seconds. In one or more embodiments, when the purge ring 100 is present and each of the plurality of apertures 150 has a diameter of 40 mils, the residence time of argon (Ar) is in a range of 0.6 to 0.7 seconds. In one or more embodiments, when the purge ring 100 is present and each of the plurality of apertures 150 has a diameter of 30 mils, the residence time of argon (Ar) is in a range of 0.7 to 0.8 seconds.

In one or more embodiments, the residence time of the edge purge gas in the heated pedestal assembly may be changed by changing a size of the plurality of apertures 150. In one or more embodiments, the residence time of the edge purge gas in the heated pedestal assembly increases when the size of the plurality of apertures 150 is smaller.

In one or more embodiments, an edge temperature of the substrate support 200 where a purge ring 100 is present is in a range of 2° C. to 5° C. greater than an edge temperature of the substrate support 200 where a purge ring is not present. In one or more embodiments, a center temperature of the substrate support 200 where a purge ring 100 is present is in a range of 5° C. to 10° C. greater than a center temperature of the substrate support 200 where a purge ring is not present. In one or more embodiments, when the purge ring 100 is present and each of the plurality of apertures 150 has a diameter of 40 mils, the argon (Ar) temperature is in a range of 5° C. to 15° C. greater than an argon (Ar) temperature where a purge ring is not present. In one or more embodiments, when the purge ring 100 is present and each of the plurality of apertures 150 has a diameter of 30 mils, the argon (Ar) temperature is in a range of 15° C. to 50° C. greater than an argon (Ar) temperature where a purge ring is not present.

In one or more embodiments, the plurality of channels each have a channel volume. In one or more embodiments, a temperature of the channel volume of each of the plurality of channels is different. In one or more embodiments, the temperature of the channel volume of each of the plurality of channels is the same. In one or more embodiments, the channel volume temperature of each of the plurality of channels where a purge ring is not present is in a range of from 200° C. to 250° C. In one or more embodiments, when the purge ring 100 is present and each of the plurality of apertures 150 has a diameter of 40 mils, the channel volume temperature is in a range of 250° C. to 300° C. In one or more embodiments, when the purge ring 100 is present and each of the plurality of apertures 150 has a diameter of 30 mils, the channel volume temperature is in a range of 300° C. to 350° C.

In one or more embodiments, an edge purge gas flowing through the edge purge flow path 280 has a temperature greater than or equal 15° C. higher than a gas flowing through the edge purge flow path without the purge ring. In one or more embodiments, an edge purge gas flowing through the edge purge flow path 280 has a temperature greater than or equal 10° C., 5° C., 4° C., 3° C., 2° C., or 1° C. higher than a gas flowing through the edge purge flow path without the purge ring.

In one or more embodiments, a pocket below the edge ring forms a low pressure zone. In one or more embodiments, the processing method comprises reducing a volume of the pocket below the edge ring. In one or more embodiments, reducing the volume of the pocket below the edge ring eliminates the low pressure zone. In one or more embodiments, the purge ring 100 can be positioned on the substrate support 200 in a manner to reduce a size of the pocket below the edge ring. In one or more embodiments, reducing the size of the pocket below the edge ring increases the residence time of argon (Ar).

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:

1. A pedestal assembly comprising:
   a substrate support having a support surface with a support surface outer edge and an outer peripheral ledge with a ledge top surface and a ledge outer peripheral face, the outer peripheral ledge having a plurality of circumferentially spaced purge outlets extending radially inward from the ledge outer peripheral face into the substrate support, the ledge top surface below the support surface; and
   a purge ring having an inner diameter face and an outer diameter face defining a thickness of the purge ring, and a top surface and a bottom surface defining a height of the purge ring, the purge ring comprising a plurality of apertures extending through the thickness and aligned circumferentially with the plurality of circumferentially spaced purge outlets, wherein the substrate support and purge ring comprise complementary alignment features configured to cooperatively interact to align the plurality of apertures with the plurality of circumferentially spaced purge outlets.

2. The pedestal assembly of claim 1, wherein the plurality of apertures has in a range of 6 to 36 apertures.

3. The pedestal assembly of claim 1, wherein each of the apertures in the purge ring are aligned with one of the circumferentially spaced purge outlets in the substrate support.

4. The pedestal assembly of claim 1, wherein the purge ring further comprises a thermal expansion feature.

5. The pedestal assembly of claim 1, wherein the purge ring is removable from the substrate support.

6. The pedestal assembly of claim 1, wherein the purge ring has a thickness in a range of 1 mm to 5 mm.

7. The pedestal assembly of claim 1, wherein the purge ring has an inner diameter in a range of 0.5 mil to 5 mil greater than an outer diameter of the ledge outer peripheral face when the substrate support and the purge ring are at a temperature of 375° C.

8. The pedestal assembly of claim 1, wherein each of the plurality of apertures in the purge ring has a hydraulic diameter in the range of 10 mil to 80 mil.

9. The pedestal assembly of claim 1, wherein each of the plurality of apertures are round with a diameter in a range of 20 mil to 50 mil.

10. The pedestal assembly of claim 9, wherein each of the plurality of apertures have a larger opening in the outer diameter face than the inner diameter face and the diameter of each of the apertures is measured at the inner diameter face.

11. The pedestal assembly of claim 1, further comprising a support base having a top surface, the substrate support having a plurality of recesses formed in a bottom surface of the substrate support so that when the substrate support is connected to the support base, the plurality of recesses form a plurality of channels to allow a gas to flow through the substrate support to the plurality of circumferentially spaced purge outlets.

12. The pedestal assembly of claim 11, further comprising an edge ring positioned on an outer peripheral portion of the top surface of the support base, the edge ring having a purge face extending inwardly over the ledge top surface to a purge inner face spaced a distance from the support surface outer edge to form an edge purge flow path between the ledge outer peripheral face, through the purge ring and between the ledge top surface and the purge face and between the support surface outer edge and purge inner face.

13. The pedestal assembly of claim 12, wherein a gas flowing through the edge purge flow path has a temperature greater than or equal 15 QC higher than a gas flowing through the edge purge flow path without the purge ring.

14. The pedestal assembly of claim 1, wherein the substrate support comprises a heater.

15. A purge ring for a substrate support pedestal, the purge ring comprising:
- an inner diameter face and an outer diameter face defining a thickness of the purge ring in a range of 1 mm to 5 mm, a top surface and a bottom surface defining a height of the purge ring, and a thermal expansion feature;
- a plurality of apertures in a range of 6 to 36 apertures, each of the plurality of apertures having a round shape with a diameter in a range of 20 mil to 50 mil, each of the plurality of apertures extending through the thickness of the purge ring and aligned circumferentially with a plurality of circumferentially spaced purge outlets in the substrate support pedestal, wherein the substrate support pedestal and purge ring comprise complementary alignment features configured to cooperatively interact to align the plurality of apertures with the plurality of circumferentially spaced purge outlets; and
- an inner diameter in a range of 0.5 mil to 5 mil greater than an outer diameter of a ledge outer peripheral face of the substrate support pedestal when the substrate support pedestal and the purge ring are at a temperature of 375° C.

* * * * *

UNITED STATES PATENT AND TRADEMARK OFFICE
CERTIFICATE OF CORRECTION

PATENT NO. : 11,976,363 B2  
APPLICATION NO. : 17/407086  
DATED : May 7, 2024  
INVENTOR(S) : Muhannad Mustafa et al.

Page 1 of 1

It is certified that error appears in the above-identified patent and that said Letters Patent is hereby corrected as shown below:

In the Claims

Claim 13, Line 3, replace "Q" after "greater than or equal 15" and before "C higher than" with "°".

Signed and Sealed this  
Twenty-fifth Day of June, 2024

Katherine Kelly Vidal  
*Director of the United States Patent and Trademark Office*